United States Patent
Sasaki et al.

[11] Patent Number: 5,940,235
[45] Date of Patent: Aug. 17, 1999

[54] REPRODUCING CIRCUIT FOR A MAGNETIC HEAD INCORPORATING THE VOLTAGE-TO-CURRENT AND AN EXPONENT CURRENT AMPLIFIER

[75] Inventors: Yasuo Sasaki, Kanagawa; Munekatsu Fukuyama, Tokyo; Kazuo Kurihara, Kanagawa, all of Japan

[73] Assignee: Sony Corporation, Tokyo, Japan

[21] Appl. No.: 08/264,473

[22] Filed: Jun. 23, 1994

Related U.S. Application Data

[62] Division of application No. 08/146,708, Nov. 1, 1993.

[30] Foreign Application Priority Data

| Oct. 30, 1992 | [JP] | Japan | P04-293307 |
| Mar. 18, 1993 | [JP] | Japan | P05-058675 |
| Mar. 31, 1993 | [JP] | Japan | P05-097150 |

[51] Int. Cl.$^6$ ............................................. G11B 5/02
[52] U.S. Cl. .................... 360/67; 330/9; 330/259
[58] Field of Search .................... 360/46, 53, 66, 360/67, 113; 307/492; 330/291, 60, 296, 9, 259; 363/165

[56] References Cited

U.S. PATENT DOCUMENTS

| 3,989,998 | 11/1976 | Chaprnka et al. | 363/165 |
| 4,691,259 | 9/1987 | Imakoshi et al. | 360/113 |
| 5,103,353 | 4/1992 | Jove et al. | 360/67 |
| 5,150,076 | 9/1992 | Asazawa | 330/296 |
| 5,200,655 | 4/1993 | Feldt | 307/492 |
| 5,270,883 | 12/1993 | Umeyama | 360/67 |
| 5,282,094 | 1/1994 | Ngo | 360/46 |
| 5,305,157 | 4/1994 | Wada et al. | 360/53 |
| 5,309,295 | 5/1994 | Bailey et al. | 360/66 |
| 5,309,297 | 5/1994 | Funahashi | 360/67 |
| 5,323,278 | 6/1994 | Contreras et al. | 360/67 |

FOREIGN PATENT DOCUMENTS

| A-0 241 770 | 10/1987 | European Pat. Off. . |
| A-0 361 781 | 4/1990 | European Pat. Off. . |
| A-0 459 579 | 12/1991 | European Pat. Off. . |

OTHER PUBLICATIONS

IBM Technical Disclosure Bulletin, Recovery Circuit for Magneto–Resistive Head Switching, vol. 33, No. 4, Sep. 1, 1990, pp. 336–337.

*Primary Examiner*—Aristotelis M. Psitos
*Assistant Examiner*—Patrick Wamsley
*Attorney, Agent, or Firm*—Hill & Simpson

[57] ABSTRACT

A recording/reproducing apparatus for a magneto-resistive (MR) head having a playback amplifier, including a capacitor for a dc feedback low-pass filter for dc feedback to an initial-stage transistor, and a differential amplifier (gm amplifier), and a switching device for the gm amplifier and for the initial-stage amplifier operable at the time of recording/playback switching. The timing of the switching device is deviated for shortening the switching time interval. To this end, an output of the initial-stage transistor of a playback amplifier for a MR head is compared to reference voltage Vref by a gm amplifier and the low-pass filter is constituted by transconductance gm of the gm amplifier and the capacitance of the capacitor, with the dc output of the gm amplifier being fed back to the base of the initial-stage amplifier. The delay in switching time by the charging of the capacitor caused by the difference in the rise time of the initial-stage transistor and the gm amplifier is deviated by the control signal from a control circuit to control the initial-stage transistor and the gm amplifier.

5 Claims, 16 Drawing Sheets

5,940,235

REPRODUCING CIRCUIT FOR A MAGNETIC HEAD INCORPORATING THE VOLTAGE-TO-CURRENT AND AN EXPONENT CURRENT AMPLIFIER

This is a division of application Ser. No. 08/146,708, filed Nov. 1, 1993.

BACKGROUND OF THE INVENTION

This invention relates to a recording/reproducing apparatus advantageously employed for a magneto-resistive head, referred to herein as an MR head. More particularly, it relates to a recording/reproducing apparatus for the MR head designed for reducing the recording/reproducing switching time interval.

The MR head has hitherto been employed, besides the usual induction head, as a playback head for a hard disc drive (HDD). The MR head is designed so that its thin magnetic film is changed in resistivity under the effect of a magnetic field from a magnetic medium, the change in resistivity being detected as a playback output voltage. The MR head exhibits a high output and a low crosstalk and is free from velocity dependency so that it is widely employed as a head for high density recording/playback for e.g. a digital/audio tape recorder.

Since the MR head is a playback head, it is stacked on or placed side by side with an induction thin film type recording head on one and the same substrate, or is integrated with an independent recording head, if the MR head is to be used as a recording/playback head.

Among a variety of different constructions of the MR head, there is known a shield type MR head shown for example in FIG. 20.

The shield type magnetic head, shown in FIG. 20, has an MR device 13, placed within a gap 12 defined between a pair of shield cores 11, and connected as one to a signal conductor 14. A bias conductor 15, placed side by side with the signal conductor 14, is also arranged within the gap 12. A signal magnetic field from a magnetic medium is directly picked up by the MR device 13.

Besides the above-described current bias type MR head, there is also known an MR head which is not in need of the bias conductor 15, such as a shunt bias type MR head. With such a MR head, the magnetic field is generated by the MR current itself flowing through the signal conductor 14.

The construction of the playback head for the above-mentioned current bias type MR head 1 is shown in FIG. 21, in which the MR current is caused to flow through the MR device 13 from a current source 2, and changes in resistance of the MR device 13 caused by the signal magnetic field from the magnetic medium are taken out as a voltage, while the bias current is caused to flow through the bias conductor 15 from a bias current source 16 for applying the bias magnetic field across the MR device 13 for producing a linear operation of the MR device 13.

One end of the bias conductor 15 and of the MR device 13 are grounded as shown, and the voltage from the MR device 13 is supplied via a direct current blocking capacitor 3 to a playback amplifier 4 for amplification as an unbalanced output.

The capacitance of the direct current blocking capacitor 3 is selected substantially in a range of from 0.01 µF to 0.1 µF, depending on the bit rate, in order to allow the passage of an input signal in such an amount as not to lower the error rate.

The shunt bias type MR head has a playback circuit which is substantially the same as that shown in FIG. 21 except that the bias current source 16 and the bias conductor 15 shown therein are not employed.

FIG. 22 shows an example of a playback circuit for the MR head.

The MR head has its MR device 13 connected to an emitter of a base-grounded transistor 22 which plays the role of a first stage amplifier. The MR device 13 is connected between the emitter and the ground of the transistor 22 which has its collector connected via a load resistor 23 to a Vcc voltage source. The collector output signal of the transistor 22 is supplied to a so-called gm amplifier 24 (voltage to current converting amplifier). This gm amplifier 24 is of a differential input type and has its non-inverting input terminal and its inverting input terminal supplied with the collector output signal voltage Vcl and with a reference voltage Vref from a reference voltage source 25, respectively. The output current of the gm amplifier 24 is supplied to a capacitor 26 (LPF capacitor). The low frequency component, above all, the dc component, in the output current is allowed to pass through a low-pass filter defined by the gm (transconductance) value of the gm amplifier 24 and the capacitance of the capacitor 26 so as to be fed back to the base of the transistor 22 of the first-stage amplifier.

The cut-off frequency fc of the low-pass filter (LPF) is determined by $$fc = 1/(2\pi C/gm) \qquad (1)$$

The gm (transconductance) value of the gm amplifier 24 is maintained at a lower value for maintaining the cut-off frequency fc at a sufficiently low value of e.g. 100 kHz or less and to realize low power consumption. The capacitance of the capacitor 26 constituting the above-mentioned LPF needs to be of a larger value on the order e.g. of 0.1 µF.

Although the recording circuit for the recording system in the MR head reproducing apparatus shown in FIG. 22 is not shown, a R/W (read/write) IC of the recording/playback circuit is arranged for reducing the power consumption in the R/W IC to as small a value as possible by turning either the recording mode or the playback mode, off when the other mode is turned on. To this end, the gm amplifier 24 and the playback amplifier 4 formed by an initial-stage transistor 22 in the R/W IC need to be turned on and off for the playback mode or the recording mode of the playback apparatus for the MR head as shown in FIG. 2.

FIG. 23 shows a timing waveform for the reproducing apparatus for the MR head of FIG. 22 when the operating mode of the R/W IC is changed over from playback to recording and thence again to playback. In this figure, the initial-stage transistor 22 and the gm amplifier 24 are turned on and off simultaneously.

The changeover signal produced by the R/W IC is "1" or "0" from the playback mode or the recording mode, respectively, as shown at A in FIG. 23.

In FIG. 23, a solid line and a broken line indicate respectively an output signal VC1 of the initial-stage transistor 22 and a reference voltage output signal Vref supplied to the gm amplifier 24, as shown at B in FIG. 23. In such case, the rise or decay timing of the gm amplifier 24 differs from those of the initial-stage amplifier 5, depending on the difference in the current capacity, such that the output signal of the initial-stage transistor 22 rises and decays earlier. The result is that a level difference ΔV is produced between the output signal VC1 of the transistor 22 and the reference voltage output signal Vref, as shown at B in FIG. 23.

Should the level difference ΔV be produced, it is detected by the gm amplifier 24 and converted into an electric current which is caused to flow through the LPF capacitor 26, so that currents IC1 and IC2 are caused to flow through the LPF capacitor 26, as shown at D in FIG. 23, by an output signal gm of the gm amplifier 24 as shown at D in FIG. 23.

When the playback mode is turned on from the recording mode, excess charges accumulated in the LPF capacitor 26 are discharged gradually after the starting of the initial-stage amplifier 22 and the gm amplifier 24 is completed, so that switching from the recording mode to the playback mode comes to a close after the recording mode/playback mode switching time interval TRW shown at D in FIG. 23. Due to the recording mode/playback mode switching time interval TRW, which depends on the capacitance of the LPF capacitor 26, having a larger value on the order of 0.1 $\mu$F, as mentioned above, there results a delay of several microseconds at the minimum.

In the playback circuit for the MR head shown in FIG. 22, the initial-stage transistor 22 or the gm amplifier 24 is switched from the off-state to the on-state when the power source is turned on. If the circuit is applied to the recording/reproducing apparatus, and the power source of the playback circuit is turned off for the recording mode for decreasing the power consumption, the transistor 22 and the gm amplifier are switched between the off-state and the on-state at the time of switching from the recording state-to the playback state and vice versa. At this time, the LPF capacitor 26 needs to be charged and discharged. However, discharging of the capacitor 26 having a larger capacitance on the order of 0.1 $\mu$F takes a prolonged time with the result that the voltage across the capacitor 26 is stabilized only after lapse of prolonged time to deteriorate the response characteristics.

For decreasing the charging/discharging time of the capacitor 26 of the larger capacity, it may be contemplated to effect quick charging/discharging by employing a gm amplifier 24 having a larger gm value. However, if the gm value is increased, the cut-off frequency fc of the LPF is increased so that effective dc feedback is disabled.

In this consideration, the present Assignee has proposed a playback circuit for the magnetic head shown in FIG. 24.

In FIG. 24, the MR device 13, base-grounded transistor 22, load resistor 23, reference voltage source 25 and the LPF capacitor 26 are the same as those shown in FIG. 22 and hence denoted by the same reference numerals. However, in the playback circuit of FIG. 24, two gm amplifiers 27, 28 having different gm values are employed. That is, the first and second gm amplifiers 27, 28 have a smaller gm value and a larger gm value, respectively.

In the playback circuit for the magnetic head shown in FIG. 24, the collector output signal of the base-grounded transistor 22 as the initial-stage amplifier is supplied to a non-inverting terminal of the first gm amplifier 27 and to the non-inverting input terminal of the second gm amplifier 28. The reference voltage Vref from the reference voltage source 25 is supplied to the inverting input terminal of the first gm amplifier 27 and to the inverting input terminal of the second gm amplifier 28. Output signals of these gm amplifiers 27, 28 are supplied to the LPF capacitor 26.

If the playback circuit is changed from the off-state to the on-state, as when the power source is turned on, the second gm amplifier 28 having the larger capacitance value is first turned on to charge the large capacitance capacitor 26, after which the first gm amplifier 27 is turned on to derive the cut-off frequency required for LPF by the gm value of the amplifier 27 and the capacitance value of the capacitor 26.

Meanwhile, if the outputs of the gm amplifiers in the steady-state condition are equal, the value of (Vref—initial stage output), which is an offset in the output signals, becomes smaller the larger the gm value. That is, since the output offset when the first gm amplifier 27 is turned on and that when the second gm amplifier 28 is turned on differ from each other, the switching between these amplifiers 27, 28 leads to dc level fluctuations in the playback output as indicated by the graph shown in FIG. 25. In this figure, the playback circuit is changed from the off-state to the on-state at time t=0, with the second gm amplifier 28 being turned on. At time t=t0, the second gm amplifier 28 is turned off, while the first gm amplifier 27 is turned on. At such time, dc fluctuations $\Delta$V is incurred in an output of the transistor 22 operated as an initial-stage amplifier. Besides, the circuit construction is complicated because of the necessity for providing a switching controlling circuit, not shown, for changing over the two amplifiers 27, 28.

SUMMARY OF THE INVENTION

The present invention provides a recording/reproducing apparatus which is free from the above-mentioned drawbacks of the prior art. It is a primary object of the present invention to provide a recording/reproducing apparatus for an MR head wherein the switching time interval from the recording mode to the playback mode and vice versa is decreased by preventing a situation in which a gm amplifier is activated when the initial-stage amplifier of the playback amplifier is not yet started, which would cause an erroneous current to flow through an LPF capacitor to charge it, as a result of which dc level fluctuations would be incurred in the playback output and can be converged to a predetermined level only after some time lapse, with the portion of the recording medium such as a hard disc traversed by the head representing a wasteful region on which recording cannot be made, and with the recording capacity being decreased correspondingly.

It is a second object of the present invention to provide a playback circuit for a magnetic head in which charging/discharging of the LPF capacitor accompanying the on/off operation of the playback circuit may be effected quickly by a simplified circuit construction without producing the dc fluctuations, and in which the switching between the two gm amplifiers may be eliminated.

The recording/reproducing apparatus for the MR head according to the present invention is so arranged that the dc component of an output of a differential amplifier, adapted for amplifying the difference between the output signal of the MR head and the reference voltage, fed back to an initial one of amplifying means for amplifying the output signal of the MR head, there being provided controlling means for controlling the on/off timings of the differential amplifier and the initial-stage amplifier so that these timings are deviated from each other.

The recording/reproducing apparatus for the MR head according to the present invention has the dc component of an output of a differential amplifier, adapted for amplifying the difference between the output signal of the MR head and the reference voltage is fed back to an initial one of amplifying means amplifying the output signal of the MR head via an LPF capacitor, so that the output current of the differential amplifier is changed at the time of quick charging/discharging of the LPF capacitor.

The recording/reproducing apparatus for the MR head according to the present invention is so arranged that the dc component of an output of a differential amplifier adapted for amplifying the difference between the output signal of the MR head and the reference voltage via a dc blocking capacitor is fed back to an initial one of amplifying means amplifying the output signal of the MR head via a dc blocking capacitor, in which the output current of the differential amplifier is changed at the time of quick charging/discharging of the do blocking capacitor.

The present invention also provides a playback circuit for a magnetic head comprising an initial-stage amplifying means for amplifying an output signal from a magneto-resistive head, a voltage-to-current converting amplifying means for amplifying a differential signal between an output signal of the initial-stage amplifying means and a reference voltage, a constant, current source connected to an output terminal of the voltage-to-current converting amplifying means, current amplifying means for amplifying an output signal of the voltage-to-current converting amplifying means, a capacitor connected to the current amplifying means, and feedback means for feeding back an output of the current amplifying means to an input side of the initial-stage amplifying means.

The present invention also provides a playback circuit for a magnetic head comprising an initial-stage amplifying means for amplifying an output signal from a magneto-resistive head, voltage-to-current converting amplifying means supplied with an output signal of the initial-stage amplifying means and having exponential input-output characteristics, a capacitor connected to an output terminal of the voltage-to-current converting amplifying means a, and feedback means for feeding back an output signal of the voltage-to-current converting amplifying means to an input side of the initial-stage amplifying means.

DESCRIPTION OF THE PREFERRED EMBODIMENTS

Figure 1:
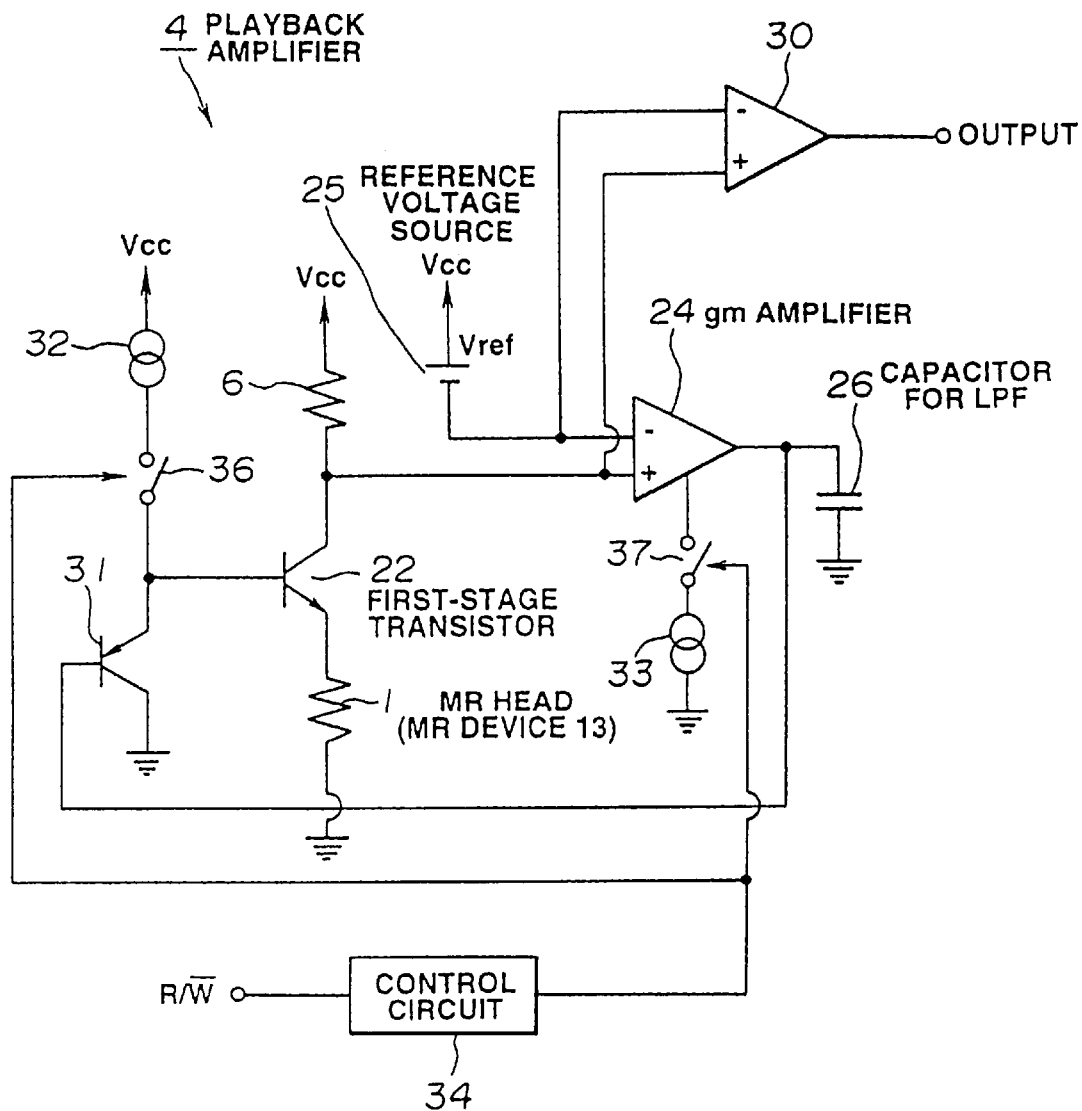
FIG. 1 is a circuit diagram showing an embodiment of a recording/playback apparatus for an MR head according to the present invention.
Figure 22:
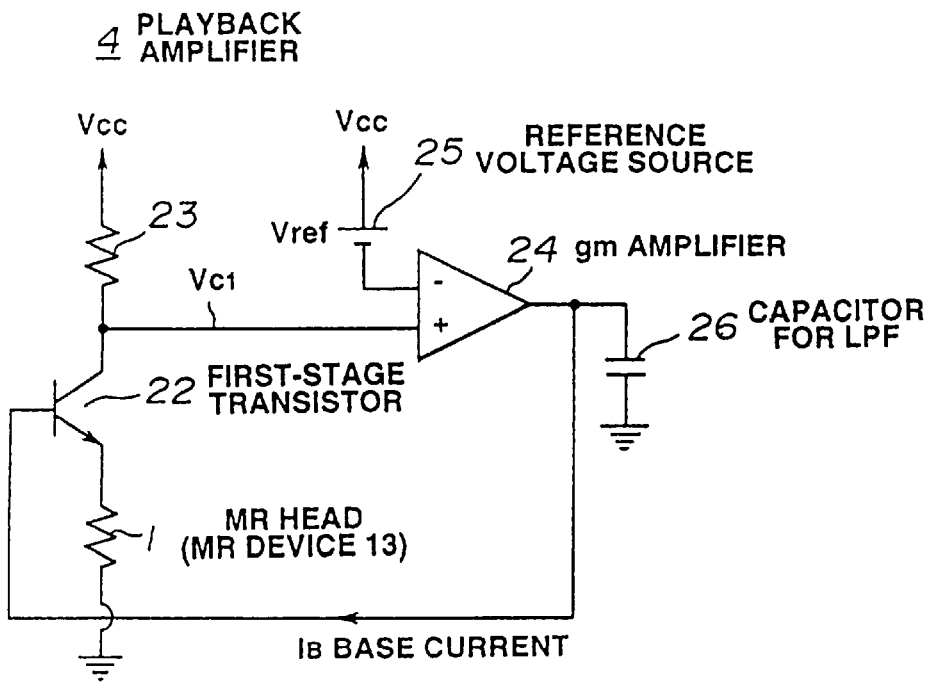
FIG. 22 is a schematic circuit diagram of another conventional recording/reproducing apparatus for the magnetic head.
Figures 23A, 23B, 23C, 23D:
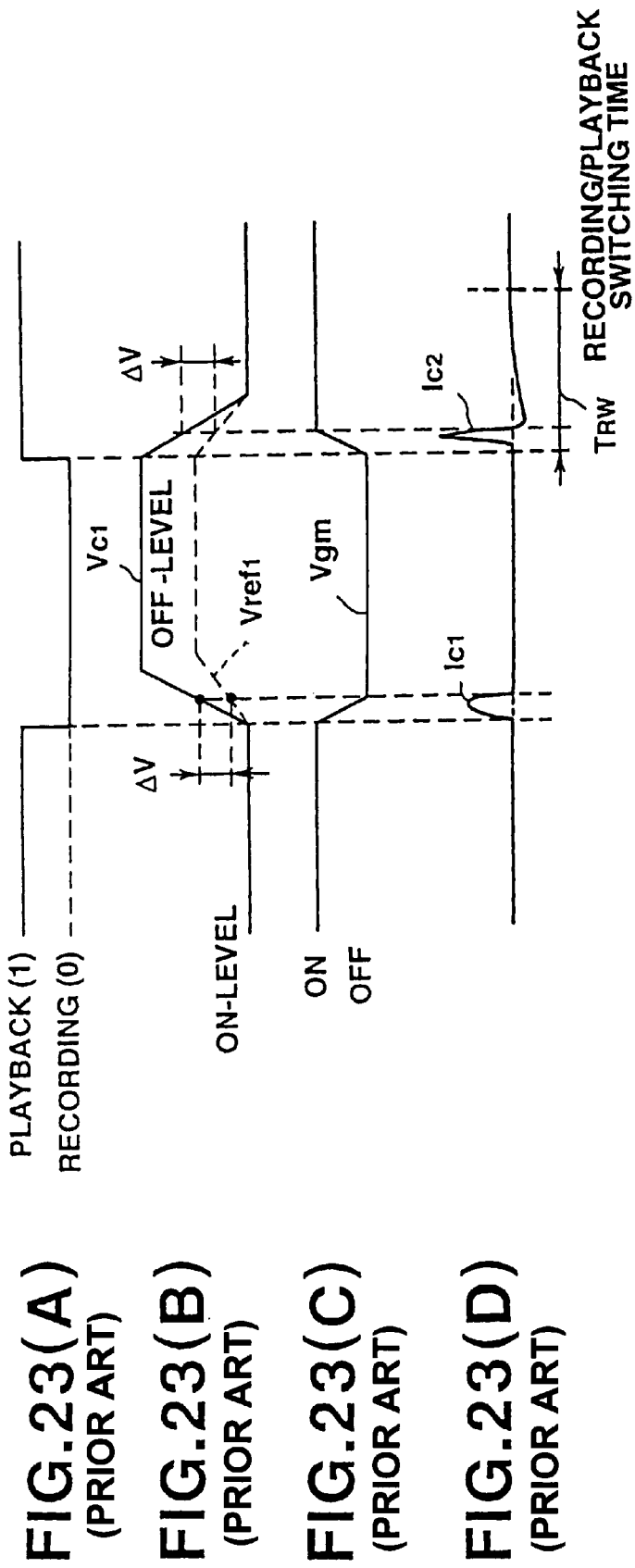
FIG. 23 is a timing chart for the conventional recording/reproducing apparatus for the magnetic head shown in the circuit diagram of FIG. 22.

FIG. 1 shows, by a schematic circuit diagram, an embodiment of the recording/reproducing apparatus for the MR head according to the present invention, in which a first-stage amplifier of the apparatus is designed as a base-grounded amplifier. In FIG. 1, parts or components corresponding to those shown in FIG. 22 are indicated by the same reference numerals.

In FIG. 1, an NPN type initial-stage transistor 22, constituting an initial-stage playback amplifier 4, is designed as a base-grounded amplifier, with an MR device 13 of an MR head 1 being connected across the emitter and the ground. Consequently, there is no need for a dc blocking capacitor 3 of a larger capacity across the MR device 13 and the transistor as is done in the initial-stage common-emitter transistor shown in FIG. 21.

The initial-stage transistor 22 has its base connected to a junction between the emitter of a switching PNP transistor 31 on one hand and a switching means 36 connected to a current source 32 for supplying the base current to the transistor 22 on the other hand. The PNP transistor has its collector grounded and has its base supplied with a feedback dc signal from a first gm amplifier 24 which will be explained subsequently.

The initial-stage transistor 22 has its collector connected via a load resistor 6 to a Vcc voltage source and to a non-inverting input terminal of a first gm amplifier 24, which is a voltage input-current output differential amplifier.

The first gm amplifier 24 has its inverting input terminal supplied with a reference voltage Vref from a reference voltage source 25. An output differential amplifier 30 has its input terminals connected to non-inverting and inverting inputs of the first gm amplifier 24.

The first gm amplifier 24 has its output terminal connected to ground via a capacitor 26 providing a low pass filter so that ac components in the output signal are transmitted through the capacitor while dc components in the output signal are fed back to the base of the PNP transistor 31. The gm amplifier 24 has a current source 33 and second switching means 37, as will be explained subsequently in connection with FIG. 2.

In the present embodiment, the first and second switching means 36, 37 are controlled by a control circuit 34, provided in an R/$\overline{W}$ IC circuit as will be explained in connection with FIG. 3, for turning on and off the gm amplifier 24 and the current sources 32, 33 for supplying the base current of the initial-stage transistor 22.

Figure 2:
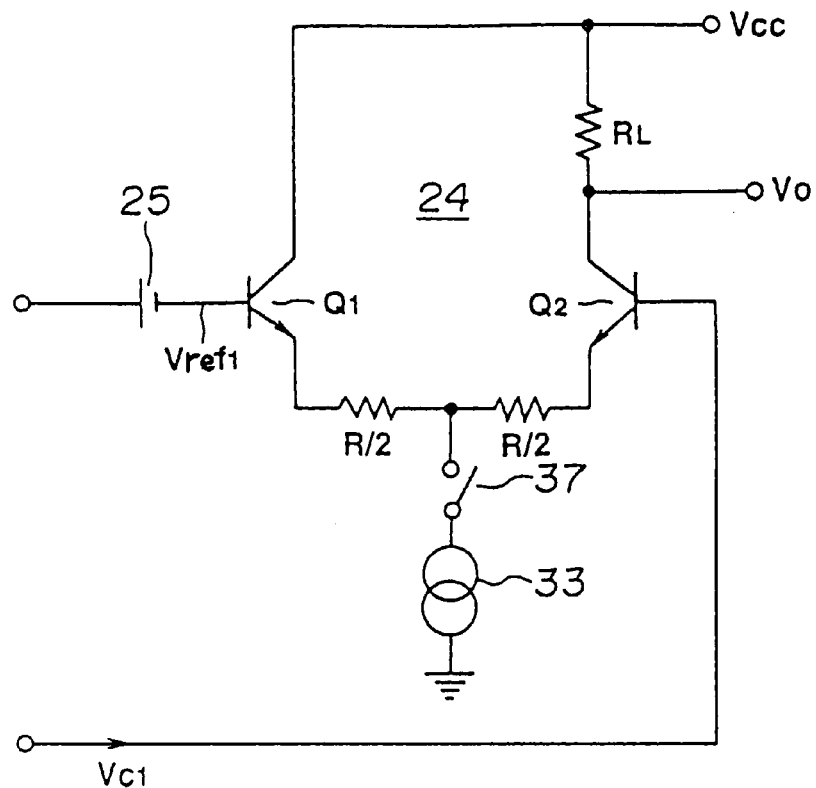
FIG. 2 is a circuit diagram showing an embodiment of a gm amplifier employed in a recording/playback apparatus for an MR head according to the present invention.

FIG. 2 shows an example of the first gm amplifier 24. A transistor Q1 has its base supplied with a reference voltage Vrefl from the reference voltage source 25, while a transistor Q2 has its base supplied with a signal VCI from the collector of the initial-stage transistor 22. The emitters of the transistors Q1 and Q2 are connected to each other via two resistors R/2. The switching means 37 connected from these resistors to ground in series with a current source 33 is controlled by an output of the control circuit 34.

Figure 3:
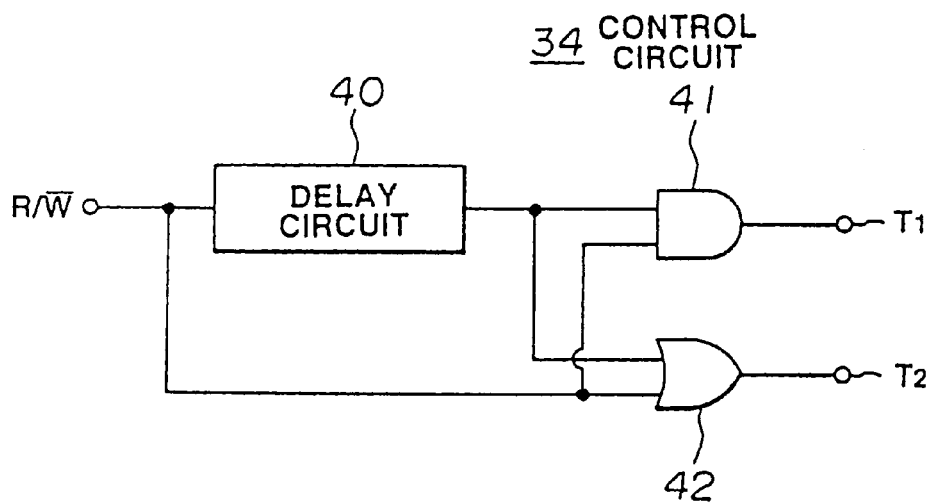
FIG. 3 is a circuit diagram showing an embodiment of a control circuit employed in a recording/playback apparatus for an MR head according to the present invention.

The control circuit 34 is provided in the R/$\overline{W}$ IC circuit as shown in FIG. 3, and is operated in such a manner that delay signals are outputted from a delay circuit 40, for delaying a changeover signal R/$\overline{w}$ for about 200 to 300 ns during the playback mode and during the recording mode, are supplied to one input terminal of an AND gate 41 and of an OR gate 42, while undelayed change over signals R/w are directly supplied to the other input terminal of the AND gate 41 and the OR gate 42, with outputs of the AND gate 41 and the OR gate 42 being outputted at an output terminal T1 and an output terminal T2, respectively. The output at the output terminal T1 and the output at the output terminal T2 perform an on/off control of the switching means 37, 36, respectively.

The operation of the recording/reproducing apparatus for the MR head, explained as above in connection with FIGS. 1 to 3, is hereinafter explained by referring to the timing chart of FIG. 4.

FIG. 4A shows the changeover signal R/$\overline{W}$ supplied to the control circuit 24 from the R/$\overline{W}$ IC. This signal becomes "1" and "0" for the playback mode and for the recording mode, respectively.

Figure 4:
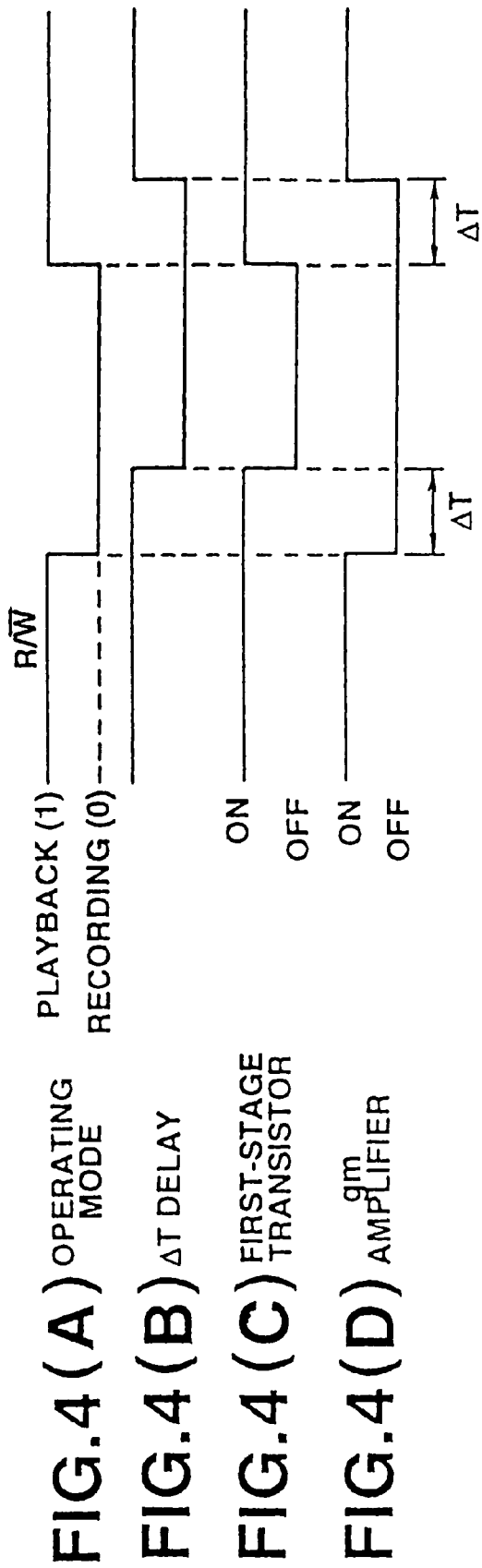
FIG. 4 is a timing chart for the circuit of the recording/playback circuit for the MR head shown in FIG. 1.

The changeover signal R/$\overline{W}$ is supplied to the delay circuit 40 shown in FIG. 3 to produce a delay by a delay time ΔT on the order of 200 ns to 300 ns to produce a delayed waveform delayed by ΔT, as shown at B in FIG. 4.

When the reproducing mode is to be switched to the recording mode, the switching means 37 of the first gm amplifier 24 is turned off by the output signal of the AND gate 41 of the control circuit 34, before the level of the output signal VC1 of the initial-stage transistor 22 is deviated by ΔT from that of the reference voltage from the reference voltage source Vref, as shown at D in FIG. 4. Then, after approximately 200 ns, the switching means 36 for the initial-stage transistor 22 is turned off by the output signal of the OR gate 42 of the control circuit 34, as shown at C in FIG. 4. The value of ΔT of approximately 200 ns suffices since it has only to be longer than the time which should elapse until the first gm amplifier 24 is completely turned off.

When the switching is made from "0" for the recording mode to "1" for the playback mode, as shown at A in FIG. 4, the first gm amplifier 24 is turned on, as shown at D in FIG. 4, after a lapse of ΔT since the time the initial-stage transistor 22 of the initial-stage playback amplifier 4 is turned on, as shown at C in FIG. 4. That is, the gm amplifier 24 is turned on by turning the switching means 37 on by the output of the AND gate 41 after the lapse of ΔT of approximately 300 ns since the time the transistor, 22 is turned on by turning the switching means 36 on by the output signal of the OR gate 42 of the control circuit 34. The value of ΔT of approximately 300 ns suffices since it has only to be longer than the time which should elapse until the output of the initial-stage transistor 22 and the reference voltage Vref of the reference voltage source 25 are both stabilized.

By shifting the on/off timing in this manner at the time of switching of the operating mode from the recording mode to the playback mode and vice versa, it becomes possible to prevent unwanted currents IC1, IC2 from flowing through the LPF capacitor 26 and hence to reduce the switching time from the recording mode to the playback mode to a value on the order ideally of ΔT.

Figure 21:
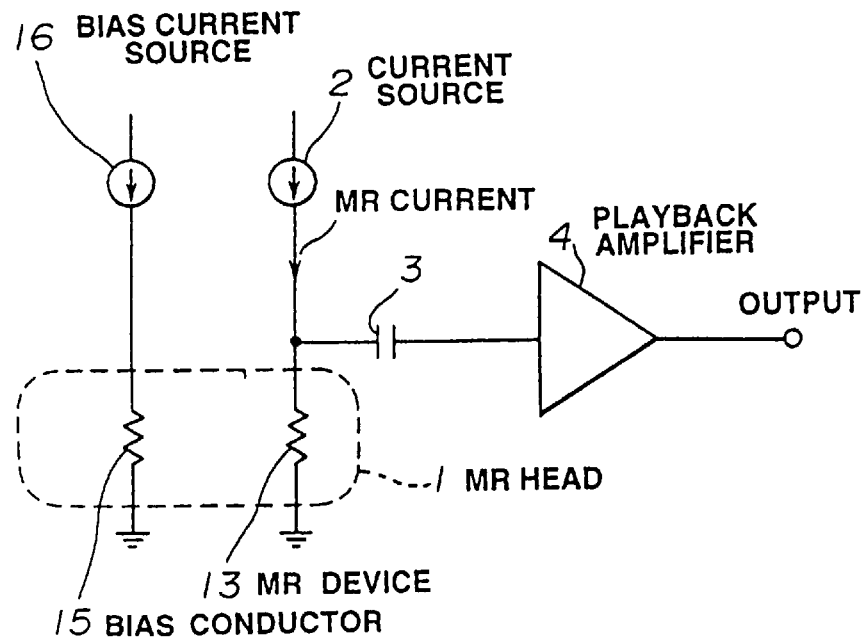
FIG. 21 is a schematic circuit diagram of a conventional recording/reproducing apparatus for the magnetic head.

With the above-described recording/reproducing apparatus from the MR head, the capacity of the LPF capacitor 26 connected to an output stage of the first gm amplifier 24 and that of the dc blocking capacitor 3 connected across the MR head 1, and the initial-stage playback amplifier 4 explained in connection with the prior-art arrangement shown in FIG. 21, both assume a larger value on the order of 0.1 $\mu$F. Consequently, for starting the operation of the initial-stage transistor 22, it is necessary to charge the LPF capacitor 26 or the dc blocking capacitor 3 up to a predetermined potential. Besides, since the resistance or the optimum sense current of the MR head when not in operation is fluctuated from one MR head to another, the potential of the dc blocking capacitor 3 or the LPF capacitor 26 is changed significantly by about hundreds of millivolts to render it necessary to perform charging and discharging operations.

Figure 5:
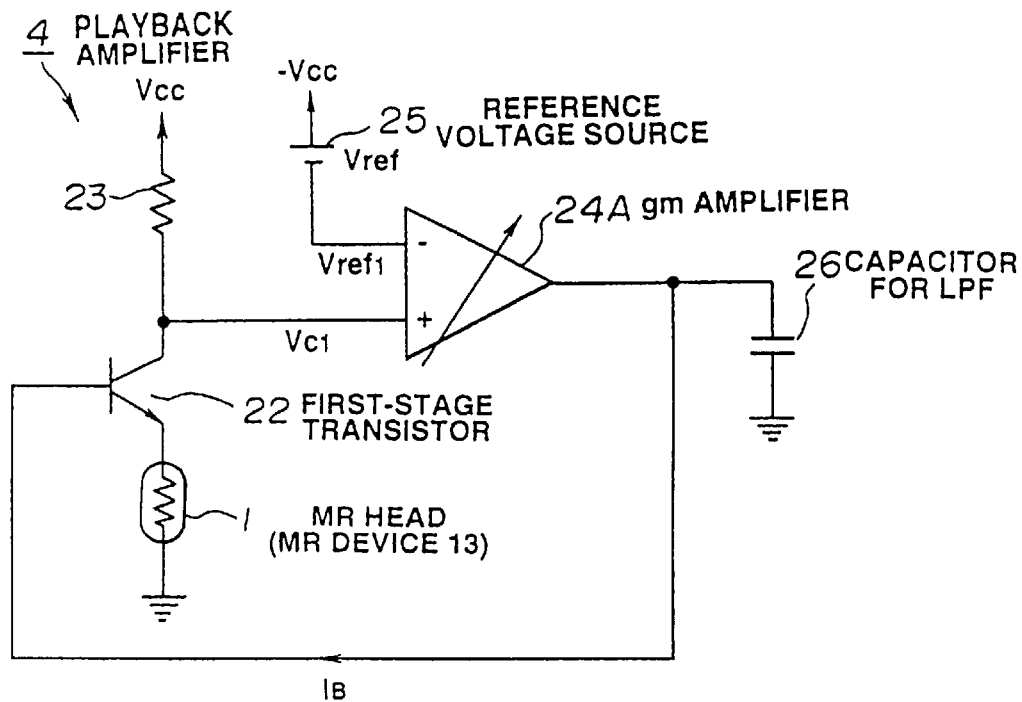
FIG. 5 is a circuit diagram showing an example of a base-grounded first stage transistor of the recording/reproducing apparatus for the MR head according to the present invention.
Figure 12:
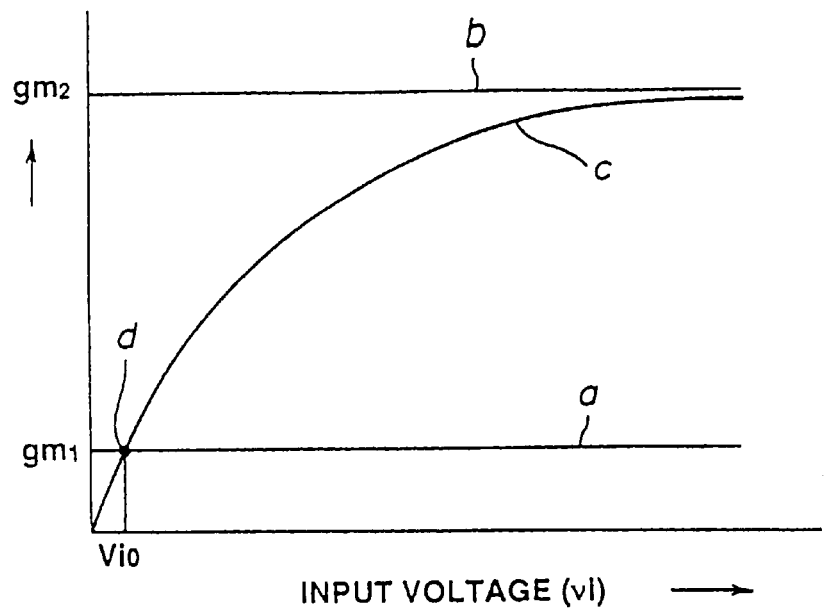
FIG. 12 is a graph for illustrating the operation of the reproducing circuit for the magnetic head shown in FIG. 10.

FIG. 5 shows a circuit in which a base-grounded amplifier is used as the initial-stage transistor. In FIG. 5, the parts or components corresponding to those shown in FIGS. 1 and 12 are indicated by the same numerals and description of the overlapping portions is omitted for simplicity. That is, in FIG. 5, a gm amplifier 24A of the variable gain type is employed in place of the first gm amplifier 24.

Figure 6:
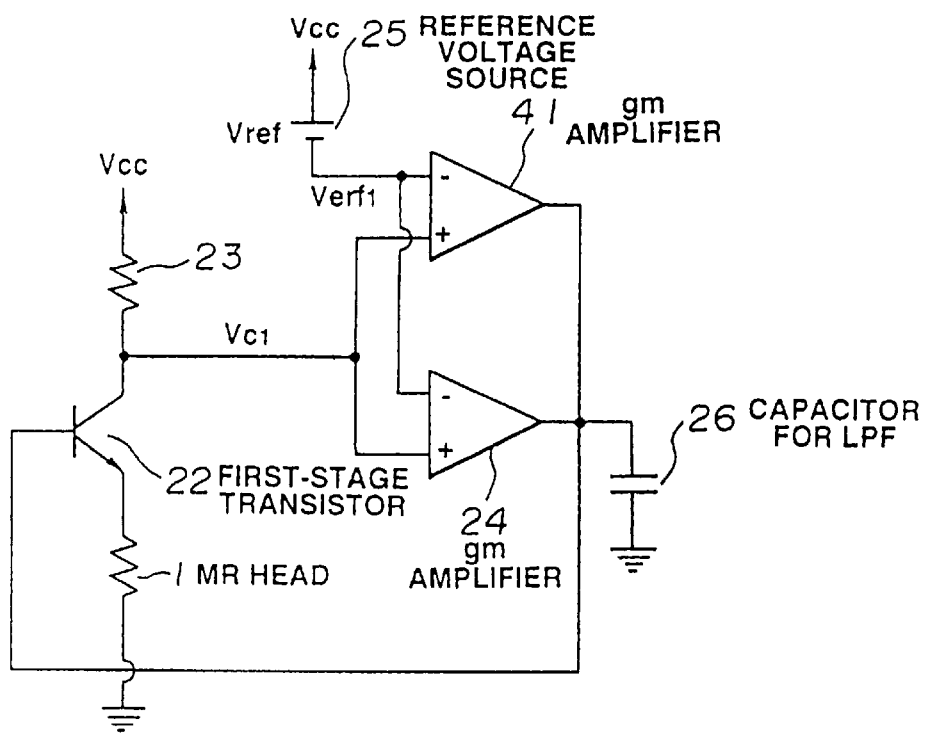
FIG. 6 is a circuit diagram showing another example of a base-grounded first stage transistor of the recording/reproducing apparatus for the MR head according to the present invention.

FIG. 6 shows a circuit in which a base-grounded amplifier similar to that employed in FIG. 5 is employed. In place of the first variable gain gm amplifier 24A, a first gm amplifier 24 and a second gm amplifier 41 are employed. The first gm amplifier 14 is selected to be of a small gm value, while the second gm amplifier 41 is selected to be larger in the gm value than the first gm amplifier 24, so that, for example, the LPF capacitor 26 may be charged and discharged abruptly. The output signal VC1 of the initial-stage amplifier 22 is supplied to the non-inverting input terminals of the first and second gm amplifiers 24, 41, while the reference voltage Vref of the reference voltage source 25 is supplied to the inverting input terminals thereof and output terminals of the first and second gm amplifiers 24, 41 are connected in common and to the LPF capacitor 26 as well as to the base of the initial-stage amplifier 22.

Figure 7:
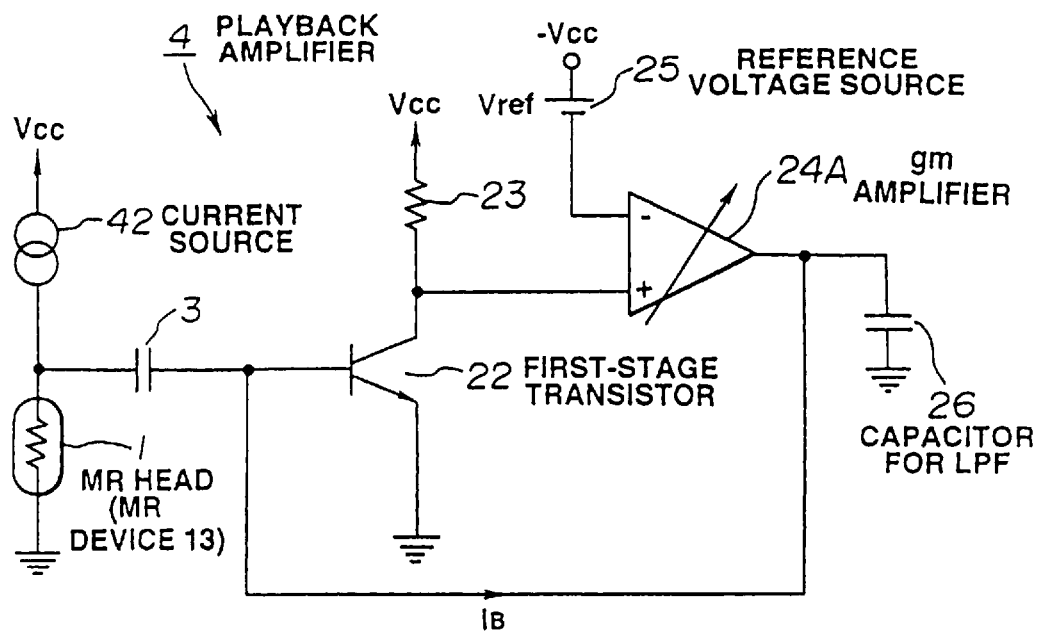
FIG. 7 is a circuit diagram showing an example of an emitter-grounded first stage transistor of the recording/reproducing apparatus for the MR head according to the present invention.

FIG. 7 shows a circuit arrangement in which the initial-stage transistor 22 of the playback amplifier 4 is designed as an emitter-grounded amplifier. The MR device 13 of the MR head 1 has one of its terminals grounded and its other end connected to a current source 42. Any change in the resistance value incurred by a signal magnetic field, and derived from a junction point between the current source 42 and the MR device 13, is supplied via dc blocking capacitor 3 to the base of the initial-stage transistor 22. The output of a variable gain gm amplifier 24A, similar to that used in FIG. 5, is fed back to a junction point between the dc blocking capacitor 3 and the base of the initial-stage transistor 22.

Figure 8:
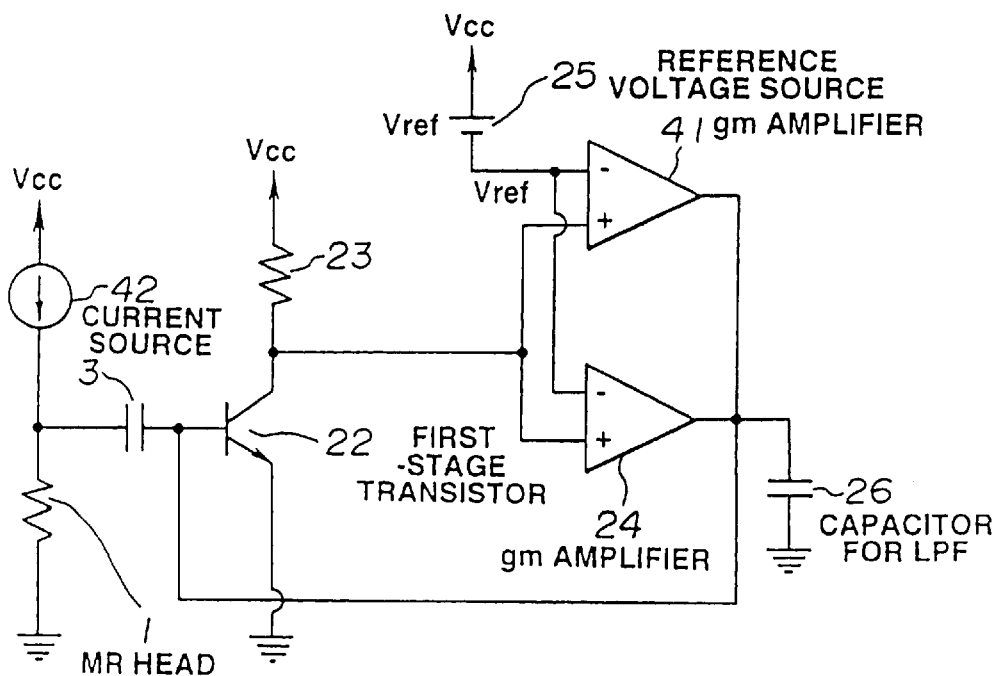
FIG. 8 is a circuit diagram showing another example of an emitter-grounded first stage transistor of the recording/reproducing apparatus for the MR head according to the present invention.

FIG. 8 shows a circuit arrangement modified from the circuit shown in FIG. 5. Thus, in the circuit arrangement of FIG. 8, a first gm amplifier 24 having a small gm value and a second gm amplifier 41 having a larger gm value are employed in place of the variable gain gm amplifier 24A.

The circuit arrangements shown in FIGS. 5 to 8 are designed for rapidly charging and discharging the LPF capacitor 26 and the dc blocking capacitor 3 of larger capacity at the time of turning on of the power source, starting from the power saving state and the head switching. With the circuit arrangements shown in FIGS. 5 to 8, the gm value is increased if the variable gain gm amplifier 24A is used, as described above, while the switching is made to the second gm amplifier 41 if the first and second gm amplifiers 24, 41 are used, as described above, so that the rise time of the initial-stage transistor 22 or the head switching time interval may be diminished in either case. Since the operation of the circuits shown in FIGS. 5 to 7 is the same in principle as that shown in FIG. 8, explanation is made by referring to the circuit diagram of FIG. 8 and to the timing chart of FIG. 9.

In the circuit arrangement shown in FIG. 8, the initial-stage transistor 22 is of an emitter-grounded type. The sense current is supplied from the current source 42 to the MR device 13 of the MR head 1. Any change in the resistance value of the MR device 13, caused by the signal magnetic field from the magnetic field, is translated into a voltage. A head output transmitted through the dc blocking capacitor 3 is amplified by the initial-stage transistor 22. The output signal VC1 of the initial-stage transistor 22 is compared by the first gm amplifier 24 to the reference voltage Vref of the reference voltage source 25. Any ac component in the result of comparison is grounded via LPF capacitor 26, while the dc component therein is fed back as a direct current to the base of the initial-stage transistor 22.

The cut-off frequency fc of the LPF is determined by the capacitance of the LPF capacitor 26 and the gm value of the first gm amplifier 24. Since fc is defined by the equation (1), as mentioned above, the capacitance C of the LPF capacitor 26 assumes a larger value of 0.1 $\mu$F if fc is kept to a lower value of 100 kHz or less and the value of gm is also kept to a smaller value for lowering power consumption. However, with the current supply capability of the first gm amplifier 24 of not more than 100 $\mu$A, the charging/discharging time for the LPF capacitor 26 or the do blocking capacitor 3 for starting the amplifier or head switching is on the order of a few microseconds.

Figure 9:
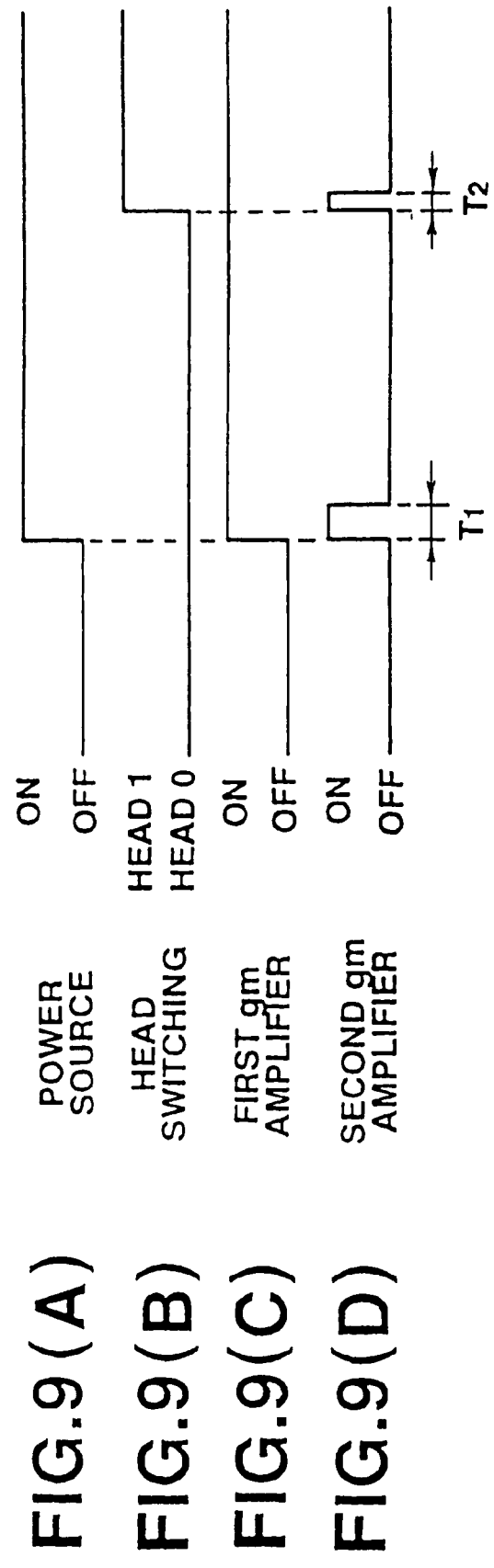
FIG. 9 is a timing chart for the circuit of the recording/reproducing circuit for the MR head shown in FIG. 8.

Thus, as shown in FIG. 9D, the second gm amplifier 41 is turned on for time intervals T1 or T2 as required when the power source is turned on and the head is switched from head "0" to head "1" as shown at A and B in FIG. 9, and with the first gm amplifier being started as shown at C in FIG. 9.

It is advisable to turn the gm amplifier 41 on and off transiently to avoid wasteful power consumption which would be increased and moreover the LPF cut-off frequency would be increased due to the larger gm value of the second gm amplifier 41 to collapse the frequency response of the playback amplifier, if the second gm amplifier 41 were operated perpetually.

In FIG. 9, the time intervals T1 and T2, during which the second gm amplifier 41 is turned on, are suitably determined by taking into account the size of the capacitors 26 or 3, the resistance value of the MR device of the MR head 1 or the sense current caused to flow through the MR head 1.

Although the circuit for on/off control of the second gm amplifier 41 is not shown in FIGS. 5 to 8, such control may naturally be made by counting the actual time by using a CPU provided in the R/W IC, or by monitoring the output of the second gm amplifier 41 for performing the on/off control based on the output of the second gm amplifier. If the variable gain gm amplifier 24A as explained in connection with FIGS. 5 and 7 is employed, such control may naturally be made by controlling the gm amplifier to a high gm state during the time intervals T1 and T2 shown in FIG. 9D.

Figure 10:
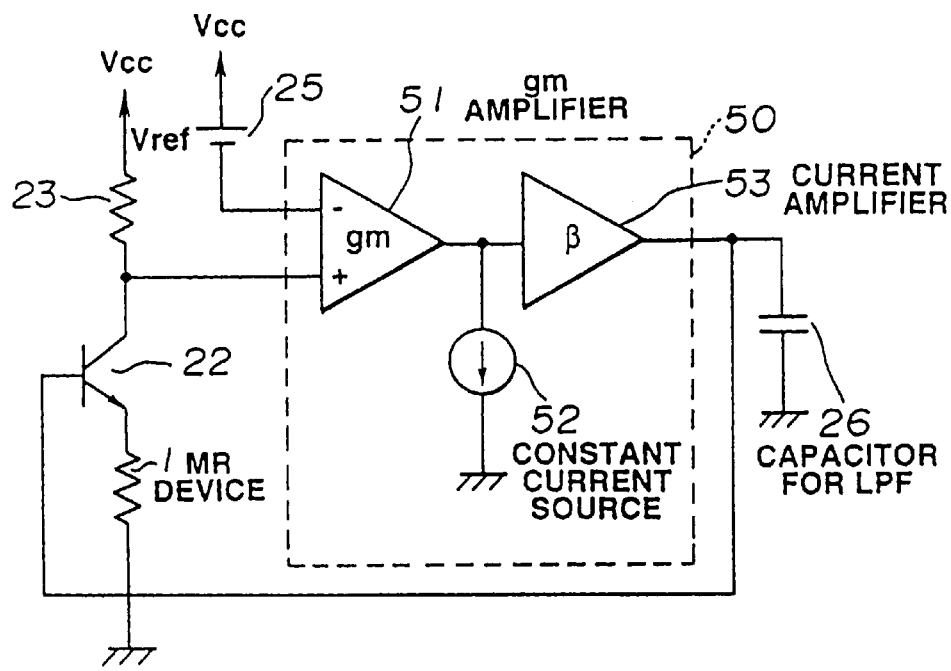
FIG. 10 is a block circuit diagram showing an embodiment of a reproducing circuit for a magnetic head according to the present invention.

FIG. 10 shows, in a block circuit diagram, the schematic construction of a modified embodiment of the playback circuit for the magnetic head according to the present invention. In FIG. 10, the parts or components similar to those of FIG. 22 are indicated by the same reference numerals.

In FIG. 10, the MR device 13 of the MR head 1 is connected to the emitter of the base-grounded transistor 22 operating as an initial-stage amplifier. That is, the MR device 13 is connected across the emitter of the transistor 22 and the ground, with the collector of the transistor 22 being connected to the Vcc voltage source via a load resistor 23. The collector output signal of the transistor 22 is amplified by an amplifying section 50 so as to be supplied to the LPF capacitor 26.

The amplifying section 50 is made up of a gm amplifier 51, which is a voltage-current transforming amplifier for amplifying a difference signal, between the output signal of the transistor 22 and the reference voltage Vref from the reference voltage source 25, a constant current source 52 connected between the ground and an output terminal of the gm amplifier 51, and a current amplifier 53 for amplifying the output signal current of the gm amplifier 51 by a factor of $\beta$. An output terminal of the current amplifier 53 of the amplifying section 50 is connected to a capacitor 26, while an output signal of the current amplifier 53 is fed back to the base of the initial-stage amplifier 22.

For producing an output current io of the amplifying section 50, an input voltage vi to the gm amplifier 51 is transformed into a current to form an output current gm vi from which a constant current Ic from the constant current source 52 is subtracted to form a residual current (gm vi−Ic) which is amplified by the current amplifier 53 by a factor of $\beta$. The output current io is given by $$io = (gm\ vi - Ic)\beta \qquad (2)$$

If the gm value of the amplifier 50 in its entirety is expressed as gmA, it is given by $$gmA = io / vi \qquad (3)$$
$$= (gmvi - Ic)\beta / vi$$
$$= gm\beta - Ic\beta / vi$$

such that the value gmA is changed with the value of the input voltage vi.

Figure 11:
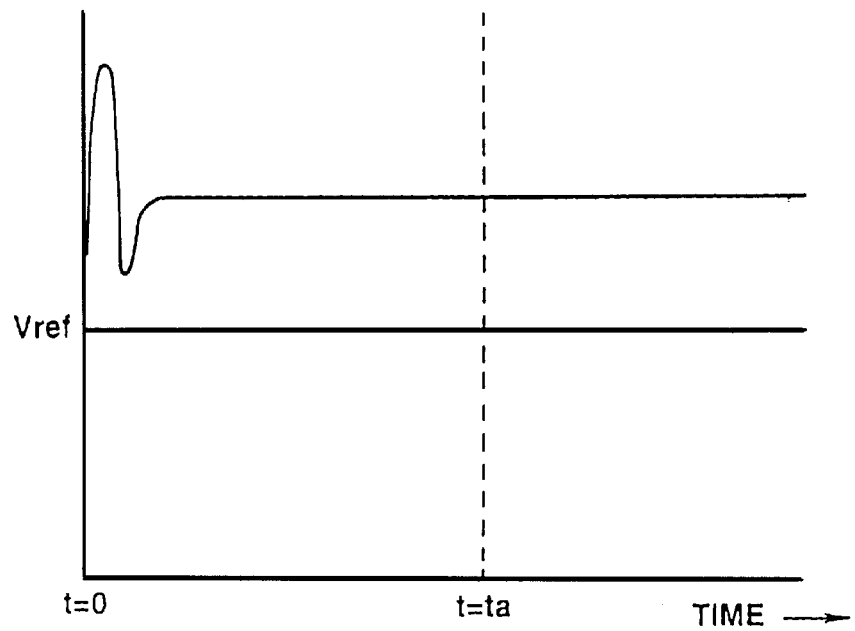
FIG. 11 is an output waveform diagram for illustrating the operation of the reproducing circuit for the magnetic head shown in FIG. 1.
Figure 24:
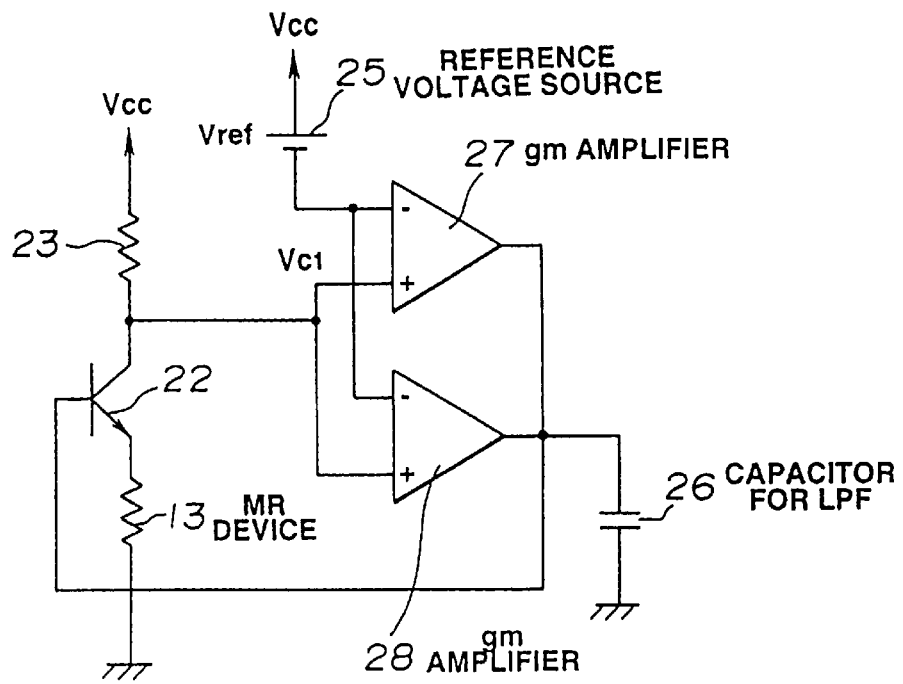
FIG. 24 is a block circuit diagram showing a proposed example of a playback circuit for a magnetic head.
Figure 25:
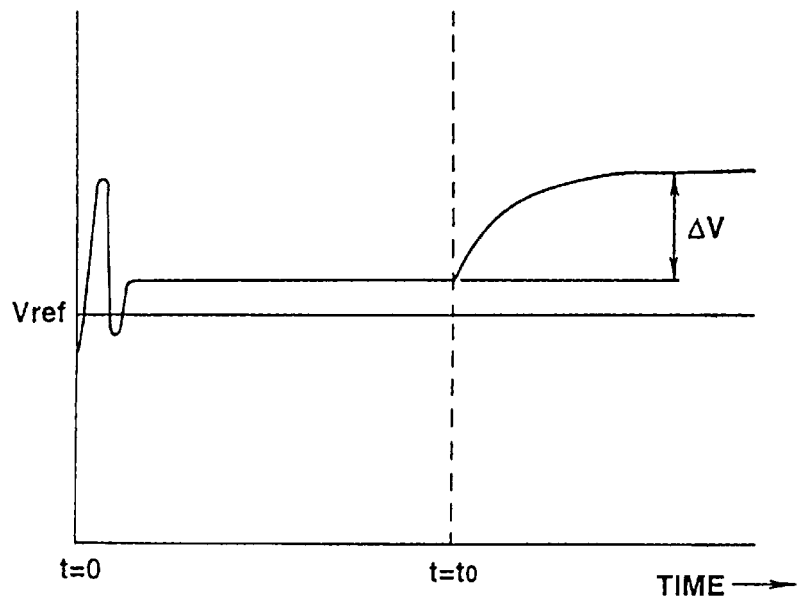
FIG. 25 is an output waveform diagram for illustrating the operation of the reproducing circuit for the magnetic circuit shown in FIG. 24.

In FIG. 11, showing an output of the initial-stage amplifier 22, an initial-stage output is not changed in the present invention, but remains constant after time t=ta corresponding to the time t0 of switching of the two gm amplifiers of FIG. 8 since time t=0 when the playback circuit is turned on. Thus there is no risk of dc current fluctuations as met in the example shown in FIG. 24.

Meanwhile, if the gm value of the first gm amplifier 27 and the gm value of the second gm amplifier 28 are set to gm1 and gm2, respectively, the gm1 and gm2 values remain constant irrespective of changes in the input voltage.

In FIG. 12, showing changes in the gm value against the input voltage vi, curves a, b and c stand for the gm value of the first gm amplifier 27 (FIG. 24) (constant value gm1), the gm value of the second gm amplifier 28 (FIG. 24) (constant value gm2) and the gm value gmA of the amplifier 50 (FIG. 10) in its entirety, respectively. The voltage vi0 at a point of intersection of the curves a and c is given by vi0=Icβ/(gm2−gm1).

It is seen from FIG. 12 that, if rapid charging/discharging is required, that is if the input voltage vi is larger, the gmA value is almost as large as the gm2 value, whereas, during the usual playback when the input voltage vi is lower, the gmA value is almost as small as the gm1 value. Consequently, it is unnecessary to make switching between two amplifiers of different gm values, with the result that the dc level fluctuations during switching may be eliminated to avoid the time losses caused by such dc level changes. This leads to shortening of time required in turning on of the power source or switching between the recording mode and the playback mode.

Figure 13:
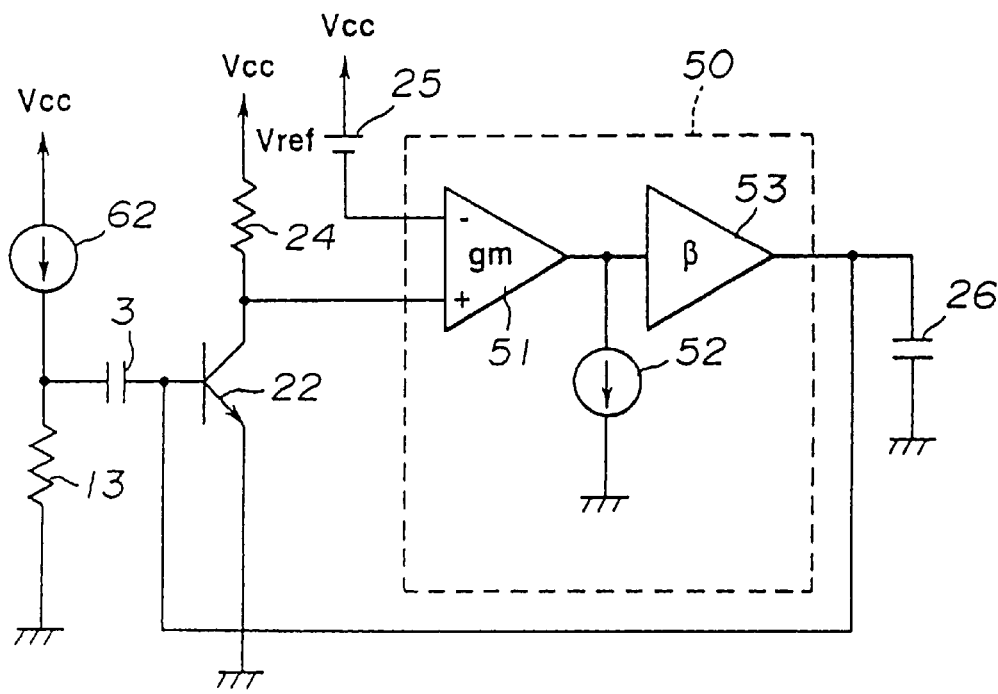
FIG. 13 is a block circuit diagram showing another embodiment of the reproducing circuit for the magnetic head according to the present invention.

FIG. 13 shows another modification of the present invention in which an emitter-grounded transistor is employed as an initial-stage transistor 22 connected to the MR device 13.

In FIG. 13, the sense current is supplied to the MR device 13 from a current source 62. Any change in voltage caused by change in resistance of the MR device 13 is taken out via a dc blocking capacitor 3 so as to be supplied to the base of the emitter-grounded transistor 22. The collector output of the transistor 22 is supplied to the amplifying section 50 made up of a gm amplifier 51, a constant current source 52 and a current amplifier 53, similarly to the amplifying section shown in FIG. 10. The gm amplifier 51 translates a differential voltage, between the output voltage of the transistor 22 and the reference voltage Vref from the reference voltage source 25, into any electric current. The output current of the current amplifier 53 is supplied to the LPF capacitor 26, while being fed back to the base of the transistor 22.

Similarly to the embodiment shown in FIG. 10, the present embodiment assures quick turning on of the power source and charging/discharging at the time of switching between the recording and playback modes to shorten the switching time or the like.

Figure 14:
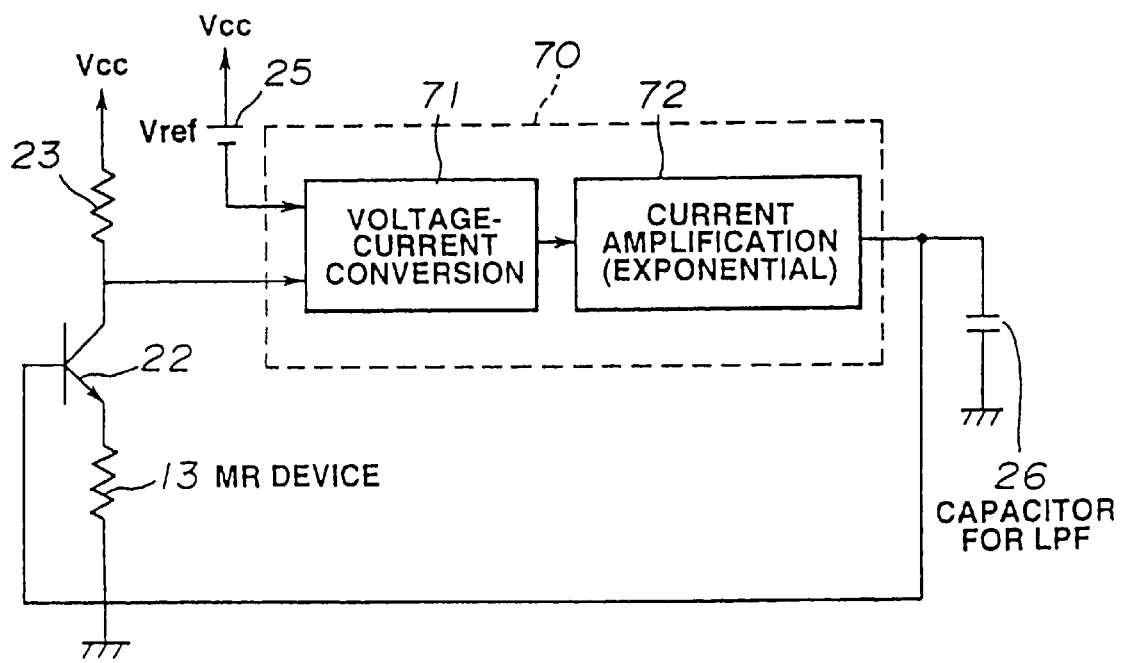
FIG. 14 is a block circuit diagram showing still another embodiment of the reproducing circuit for the magnetic head according to the present invention.

FIG. 14 shows, in a block circuit diagram, a schematic construction of a modified embodiment of the playback circuit for the magnetic head according to the present invention. In FIG. 14, the parts or components similar to those used in FIG. 22 are denoted by the same reference numerals.

In FIG. 14, the MR device 13 of the MR head is connected to the emitter of a base-grounded transistor 22 operated as an initial-stage amplifier. That is, the MR device 13 is connected across the emitter of the transistor 22 and the ground, with the collector of the transistor 22 being connected via load resistor 23 to the Vcc voltage source. The collector output signal of the transistor 22 is supplied to a LPF capacitor 26 after amplification by a voltage-current transforming amplifier (gm amplifier) 70 having exponential input/output characteristics.

The voltage-current transforming amplifier (gm amplifier) 70 is made up of a voltage-current converter 71 and a current amplifier 72. The LPF capacitor 26 is connected to an output terminal of the current amplifier 72 of the voltage-current transforming amplifier (gm amplifier) 70. The output signal of the current amplifier 72 is fed back to the base of the initial-stage transistor 22.

Figure 15:
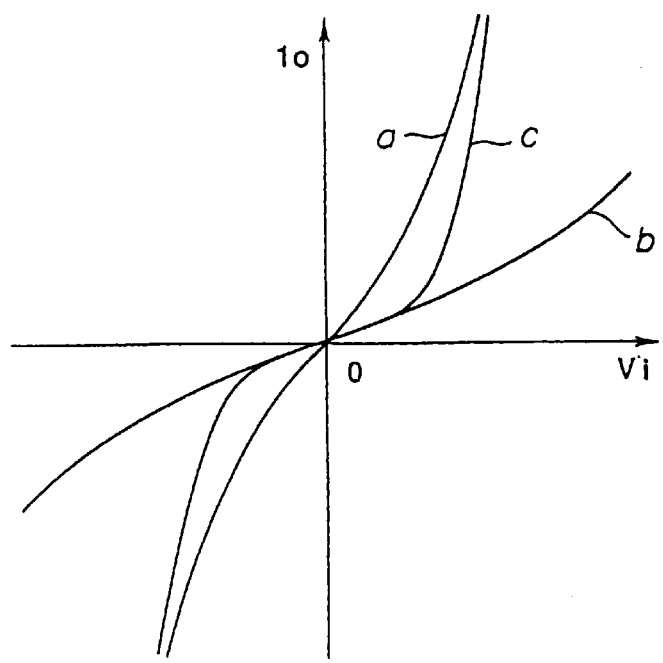
FIG. 15 is a graph showing typical input voltage (Vi) to output current (Io) characteristics of a voltage-to-current converting amplifier (gm amplifier) shown in FIG. 14.
Figure 16:
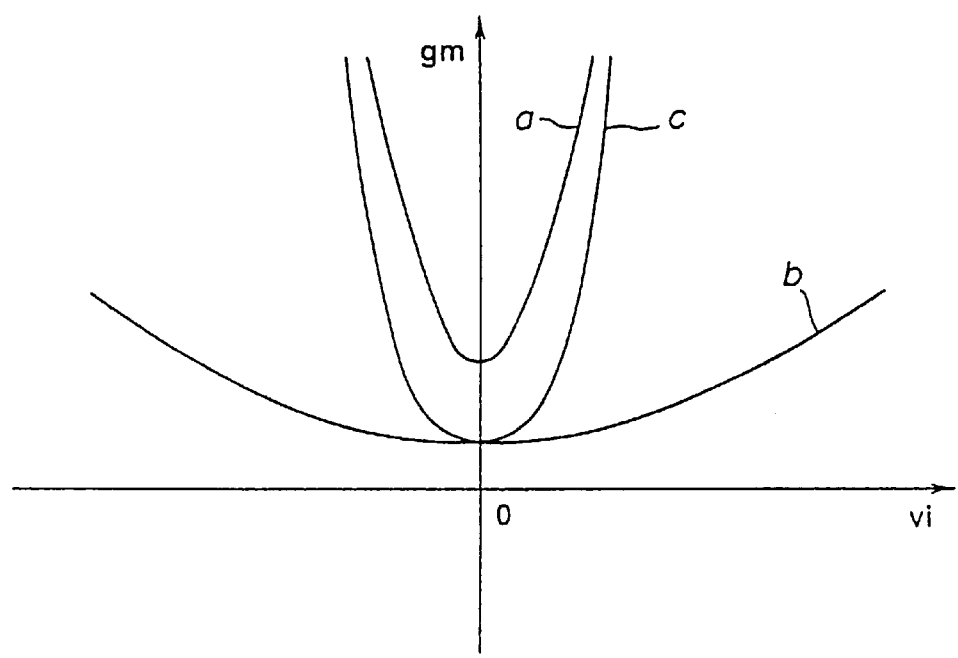
FIG. 16 is a graph showing changes in the gm value with respect to an input voltage (Vi) of the voltage-to-current converting amplifier (gm amplifier) shown in FIG. 14.
Figure 18:
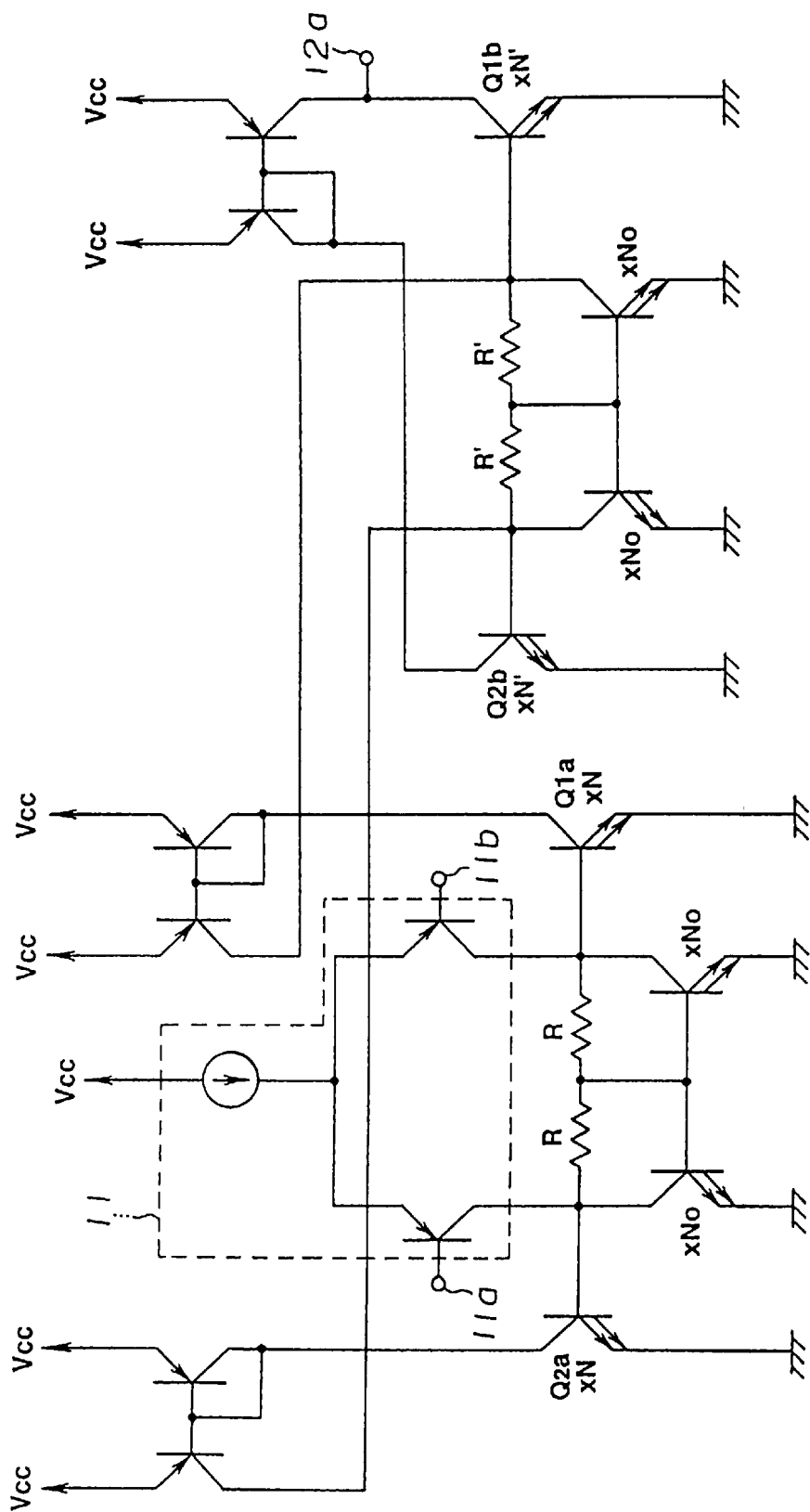
FIG. 18 is a circuit diagram showing another concrete example of the voltage-to-current converting amplifier (gm amplifier) shown in FIG. 14.

The voltage-current transforming amplifier (gm amplifier) 70, made up of the voltage-current converter 71 and the current amplifier 72, has the relation of the output signal (output current) Io with respect to the differential input voltage signal(input voltage Vi) between the output signal of the initial-stage transistor 22 and the reference voltage Vref from the reference voltage source 25, that is input/output characteristics, represented by an exponential curve shown for example in FIG. 15. Specific examples of the gm values relative to the above-mentioned input voltage Vi of the voltage-current transforming amplifier (gm amplifier) 70 are shown in FIG. 16. In these figures, characteristic curves a, b denote the characteristics for an amplifier 70 in which a current amplifier 72 is arranged in a single stage, while a characteristic curve c shows the amplifier 70 in which the current amplifier 12 is arranged in two stages, as shown in FIG. 18.

Figure 17:
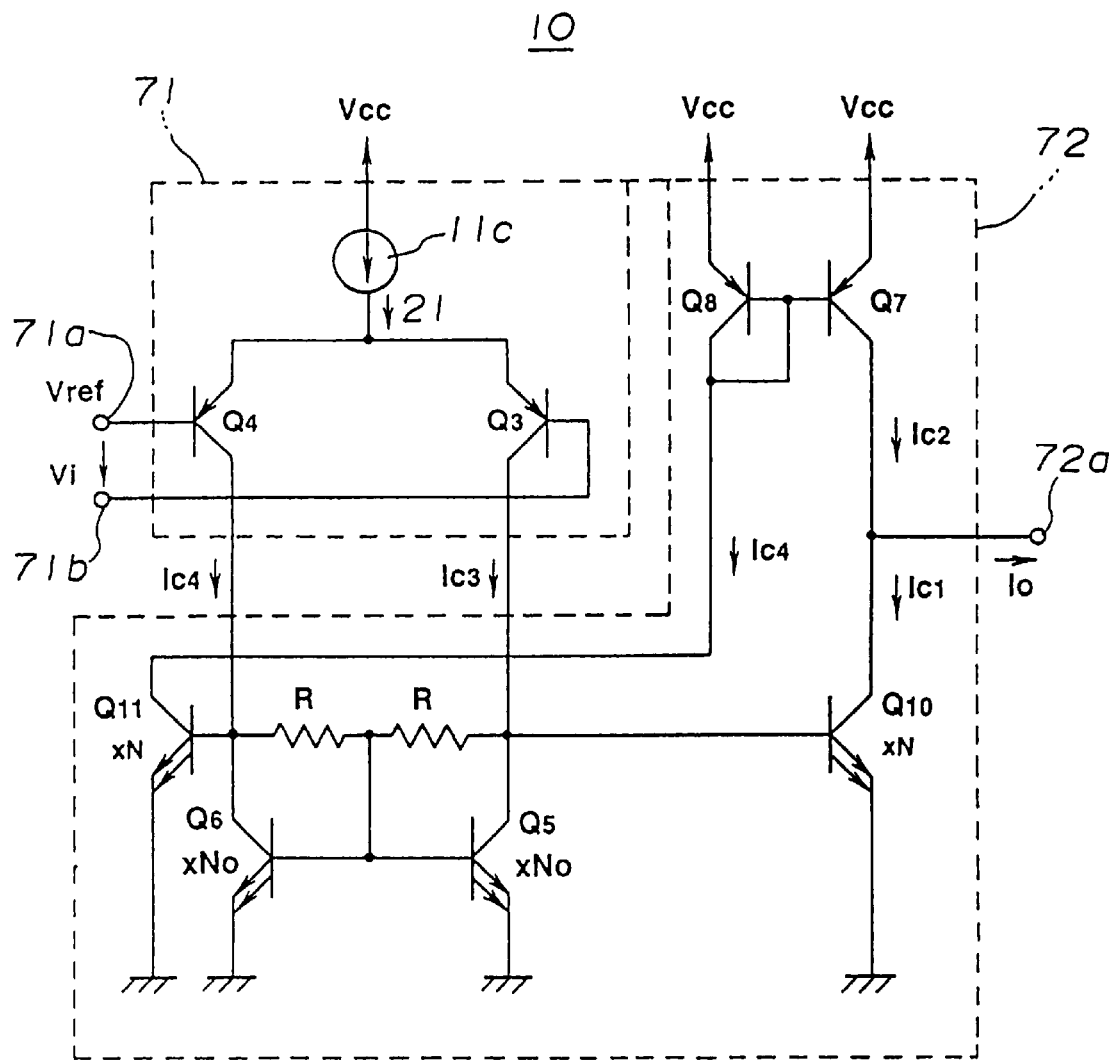
FIG. 17 is a circuit diagram showing a concrete example of the voltage-to-current converting amplifier (gm amplifier) shown in FIG. 14.

That is, referring to FIG. 17, the above-mentioned reference voltage Vref from the reference voltage source 25 and the output signal from the transistor as the initial-stage amplifier 22 are supplied to input terminals 71a and 71b of the voltage-current converter 71, with a differential voltage across the input terminals 71a, 71b being the input voltage Vi. The voltage-current converter 71 is made up of emitter-grounded PNP transistors Q3, Q4 and a constant current source 11C of a current value 21 connected to the common emitters of the transistors. The bases of the transistors Q4 and Q3 represent the input terminals 71a and 71b, respectively. If the collector currents of the transistors Q3, Q4 are denoted as Ic3 and Ic4, respectively, the following equations $$Ic3=2I/(1+exp(Vi/Vt)) \qquad (2)$$

$$Ic4=2I/(1+exp(-Vi/Vt)) \qquad (3)$$

hold, where Vt equals approximately 26 mV for a temperature substantially equal to room temperature.

If the current (Ic3−Ic4)/2 flowing through the resistors R at this time is set to i, the output current Io of the current amplifier 72 arranged as shown in FIG. 17 is given by $$Io=I(exp(iR/Vt)-exp(-iR/Vt)) \, N/No \qquad (4)$$

where N and No indicate the numbers of transistors to be connected in parallel, these transistors being transistors Q11, Q10 and Q5 and Q6, respectively, shown in FIG. 17.

The arrangement of the current amplifier 72, shown in FIG. 17, which is of a construction of a current amplifier in general, is hereinafter explained briefly. The collectors of the transistors Q3, Q4 are connected to collectors of the NPN transistors Q5 and Q6, respectively, while the bases of the transistors Q5 and Q6 are connected in common and connected to the respective collectors via resistors having a resistance R. The collectors of the transistors Q5 and Q6 are connected to the bases of the NPN transistors Q10, Q11, the collectors of which are connected to the collectors of PNP transistors Q7 and Q8 making up a voltage mirror (current invertor) circuit, respectively. If the currents flowing through the collectors of the transistors Q10, Q11 are indicated as Ic1, Ic4, respectively, the output current Io equal to (Ic2−Ic1) is outputted at an output terminal 72a connected to a junction point between the collectors of the transistors Q10 and Q7.

Some of the concrete examples of the relation between the input voltage Vi and the output current Io, as calculated from the equations (2) to (4), are shown by curves a and b in FIG. 15 for various values of the resistances R etc. in the equation (4). Since gm=dIo /dVi, the characteristics of the transconductance gm represented by the curves a and b in FIG. 15 against the input voltage Vi may be represented by curves a and b in FIG. 16. Under the steady-state condition of Vi=0, $$gm=NRI2/((NoVt2)) \qquad (5)$$

Thus, for the starting of the amplifier operation by the turning on of the power source as mentioned above, or the head switching, the input voltage Vi is increased and the transconductance gm of the voltage-current converting amplifier (gm amplifier) 70 is increased to enable the quick charging/discharging of the capacitor 26, whereas, for usual playback or the steady-state operation, the input voltage Vi is decreased to lower the transconductance gm. Besides, since changes in transconductance gm are small in the vicinity of Vi=0 under the steady-state condition, only small changes in the frequency response are incurred even if more or less offsets are produced in the operating point for some reason or other.

The concrete example of the voltage-current amplifier (gm amplifier) 70 shown in FIG. 17 is of a single-stage construction. However, if it is desired to increase and decrease the value of gm for the larger and smaller values of the input voltage Vi, respectively, and to extend the range of the input voltage Vi for which the changes in transconductance gm in the vicinity of Vi=0 is small, it is preferred that the gm amplifier 10, above all, its current amplifier 72, be of a two-stage construction, as shown for example in FIG. 18, in which two-stage amplifying sections made up of transistors Q1a, Q2a, Q1b and Q2b are employed in place of the single-stage amplifier section made up of the transistors Q10 and Q11 shown in FIG. 17. A typical example of the relation between the input voltage Vi and the output current Io for the two-stage construction (input/output characteristics) and a typical example of the relation between transconductance gm and the input voltage Vi are shown by a curve c in FIG. 15 and by a curve c in FIG. 16, respectively.

If the voltage-current converting amplifier (gm amplifier) 70 is of a two-stage construction, the transconductance gm is given under the steady-state condition of Vi=0 by $$gm=N'N2R'R12/(No3Vt3) \qquad (6)$$

Figure 19:
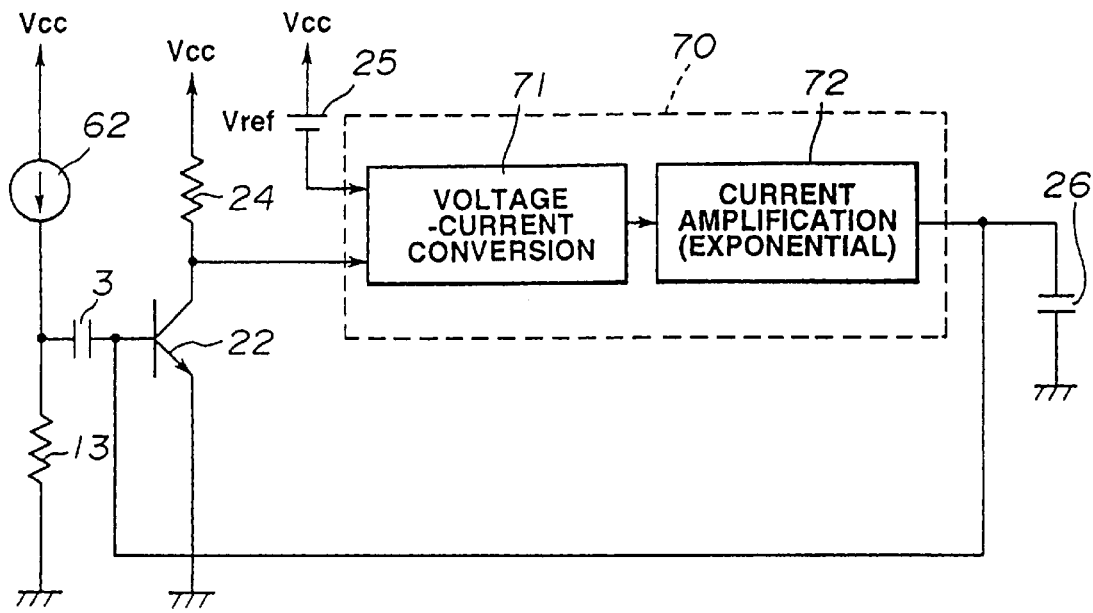
FIG. 19 is a block circuit diagram showing another embodiment of a further embodiment of the reproducing circuit for the magnetic head according to the present invention.
Figure 20:
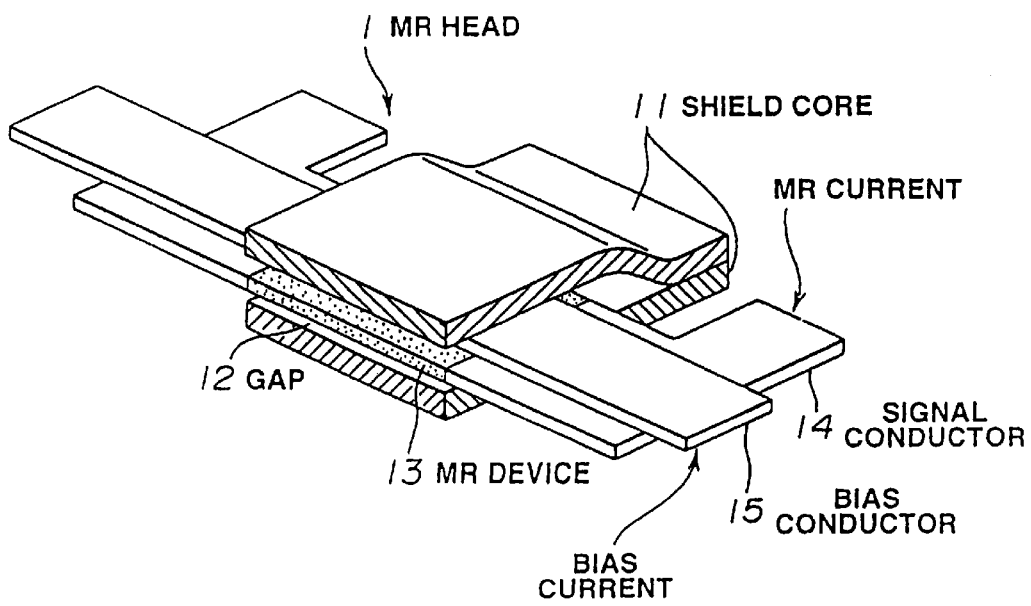
FIG. 20 is a perspective view showing a conventional shield type MR head.

FIG. 19 shows a further modification of the present invention in which an emitter-grounded transistor is employed as an initial-stage transistor 22 connected to the MR device 13.

In FIG. 19, the sense current is supplied to an MR device 13 from a current source 62. Any change in voltage caused by change in resistance of the MR device 13 is taken out via a dc blocking capacitor 3 so as to be supplied to the base of the emitter-grounded transistor 22. The collector output of the transistor 22 is supplied to a voltage-current converting amplifier (gm amplifier) 70 made up of a voltage-current converter 71 and a current transformer 72. The gm amplifier 70 outputs an output current Io related exponentially to the differential voltage between the output voltage of the transistor 22 and the reference voltage Vref from the reference voltage source 25 (input voltage Vi). The output current Io from the gm amplifier 70 is supplied to the LPF capacitor 26 while being fed back to the base of the transistor 22.

The embodiment constructed in this manner also assures quick turning on of the power source and charging/discharging at the time of switching between the recording and the playback modes for reducing the time involved in the switching operations.

We claim:

1. A playback circuit for a magnetic head comprising an initial-stage amplifying means for amplifying an output signal from a magneto-resistive head, voltage-to-current converting amplifying means supplied with an output signal of said an initial-stage amplifying means, said voltage-to-current converting amplifying means having input/output characteristics represented by an exponential function, a capacitor connected to an output terminal of said voltage-to-current converting amplifying means, and feedback means for feeding back an output of said voltage-to-current converting amplifying means to an input side of said initial-stage amplifying means.

2. The playback circuit for the magnetic head as claimed in claim 1 wherein said voltage-to-current converting amplifying means comprises a voltage-to-current converter for converting an input voltage to an electric current and a current amplifier for amplifying the current converted by said voltage-to-current converter by exponential input/output characteristics and outputting the resulting amplified current.

3. The playback circuit for the magnetic head as claimed in claim 2 wherein said current amplifier is formed by plural stages.

4. The playback circuit for the magnetic head as claimed in claim 1 wherein said initial-stage amplifying means is a base-grounded amplifier.

5. The playback circuit for the magnetic head as claimed in claim 1 wherein said initial-stage amplifying means is an emitter-grounded amplifier.

* * * * *